United States Patent [19]

Dagostino

[11] 4,346,333

[45] Aug. 24, 1982

[54] POSITION CONTROL CIRCUIT FOR A DIGITAL OSCILLOSCOPE

[75] Inventor: Thomas P. Dagostino, Beaverton, Oreg.

[73] Assignee: Tektronix, Inc., Beaverton, Oreg.

[21] Appl. No.: 76,532

[22] Filed: Oct. 29, 1979

[51] Int. Cl.³ .................... G01R 13/20; G06F 3/147; H01J 29/70
[52] U.S. Cl. .................................. 315/367; 324/112; 324/121 R; 340/722
[58] Field of Search .................... 315/367; 358/36, 51; 324/111, 112, 121; 340/722

[56] References Cited

U.S. PATENT DOCUMENTS

| | | | |
|---|---|---|---|
| 3,527,980 | 9/1970 | Robichaud et al. | 315/367 |
| 3,836,851 | 9/1974 | Schumann | 324/112 |
| 3,914,758 | 10/1975 | Ingle | 340/753 X |
| 3,996,582 | 12/1976 | Sinobad | 315/367 X |
| 4,107,739 | 8/1978 | Rossi et al. | 358/36 X |
| 4,142,146 | 2/1979 | Schumann et al. | 324/121 R X |
| 4,222,048 | 9/1980 | Johnson | 340/722 X |
| 4,246,610 | 1/1981 | Takahashi | 358/36 X |
| 4,251,754 | 2/1981 | Navarro et al. | 315/367 X |
| 4,263,593 | 4/1981 | Dagostino et al. | 340/722 X |
| 4,268,855 | 5/1981 | Takahashi | 358/36 |

*Primary Examiner*—Malcolm F. Hubler
*Attorney, Agent, or Firm*—George T. Noe

[57] ABSTRACT

A digital oscilloscope is provided with a position control circuit which permits positioning of a signal both before and after digitizing. A track and hold circuit is coupled to the position control potentiometer to generate a reference voltage which tracks the position voltage in a waveform acquisition mode, and which is held at a fixed level in a display mode while the position voltage, which is applied to the acquisition preamp, is variable adjustable. A summation circuit subtracts the reference voltage from the position voltage to provide an altered positioning voltage for the display amplifier which is zero in the acquisition mode and variable in the display mode.

5 Claims, 2 Drawing Figures

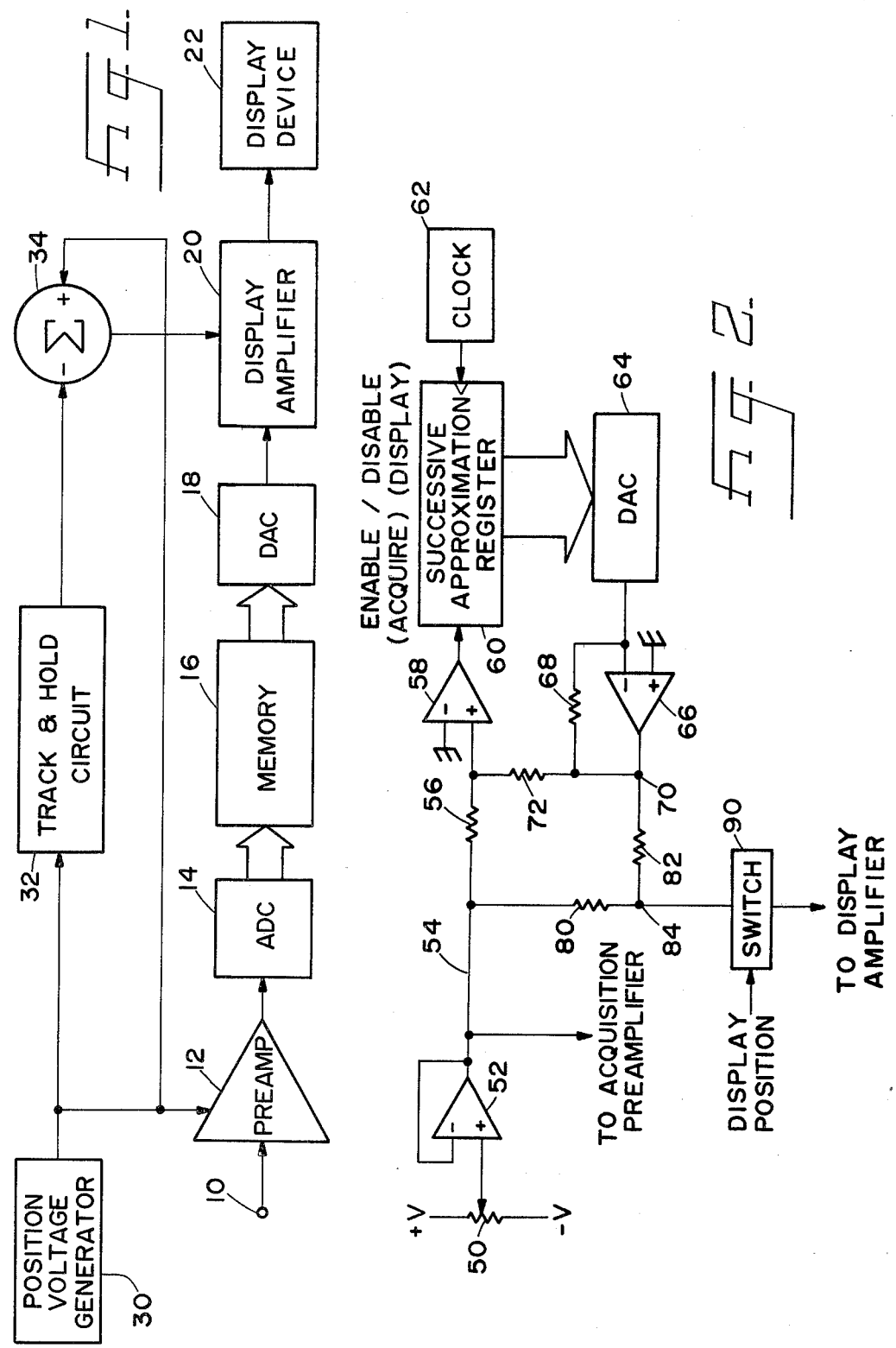

POSITION CONTROL CIRCUIT FOR A DIGITAL OSCILLOSCOPE

BACKGROUND OF THE INVENTION

In digital oscilloscopes, there are two instances in which it is desirable to shift the level of a signal. One is in the input signal preamplifier stage to position the signal within the operating-limit window of an analog-to-digital converter (ADC), and the other is in the display-generating circuits to provide vertical positioning of the display. Since both of these functions entail basically the same operation, i.e., adding or subtracting voltage, it is desirable to utilize a single position control to perform both functions. However, a problem arises in that the display screen vertical center corresponds to the center of the ADC window, so that if voltage is added to the input signal to shift it within the ADC window in the waveform acquisition mode, that voltage is also added to the display signal in the display mode, causing the display signal to shift off-screen.

SUMMARY OF THE INVENTION

In accordance with the present invention, a position control circuit is provided for a digital oscilloscope to position a signal both before and after digitizing without the undesirable effect of level shifting, or jumping of the display, when switching between the acquisition and display modes.

The position control circuit includes a position voltage generating circuit, a track and hold circuit, and a summing circuit. The position voltage generating circuit includes a potentiometer to provide at the wiper arm thereof a variably-adjustable positioning voltage in the conventional manner, and this voltage may be applied directly or via a closed switch to the acquisition preamplifier to provide the appropriate level-shifting of the input signal to position the signal within the ADC window. The track and hold circuit operates in the acquisition mode to develop a reference voltage which is equal in amplitude to the positioning voltage. The summing circuit is connected between the track and hold circuit and the position voltage generating circuit to provide a positioning voltage to the display amplifier circuit. In the acquisition mode, the reference voltage is subtracted from the position voltage, so that the output of the summing circuit is zero volts. Hence, the acquisition preamplifier receives positioning voltage while the display amplifier circuit does not. In the display mode, the track and hold circuit holds a fixed reference voltage, permitting the output of the summing circuit to vary with changes in the positioning voltage.

It is therefore one object of the present invention to provide a novel position control circuit for a digital oscilloscope.

It is another object to provide a position control circuit for a digital oscilloscope to position a signal both before and after digitizing by means of a single control without shifting the signal when switching between the acquisition and display modes.

Other objects and advantages of the present invention will become apparent upon a reading of the following description when taken in conjunction with the accompanying drawings.

BRIEF DESCRIPTION OF THE DRAWINGS

FIG. 1 is a block diagram of the vertical deflection system of a digital oscilloscope incorporating the position control circuit of the present invention; and FIG. 2 is a schematic diagram of a position control circuit in accordance with the preferred embodiment.

DETAILED DESCRIPTION OF THE INVENTION

Referring to FIG. 1, a block diagram of the vertical deflection system of a digital oscilloscope incorporating a position control circuit in accordance with the present invention is shown. An analog input signal is applied via an input terminal 10 to a preamplifier 12, which adjusts the signal to operate within the dynamic operating limits of an analog-to-digital converter (ADC) 14. The ADC 14 converts the signal to digital representations which are stored in a digital memory 16. The digital representations are subsequently retrieved from the memory 16 and converted back to analog values by a digital-to-analog converter (DAC) 18. The output of DAC 18 is applied to a display amplifier 20, which amplifies the re-constituted signal to suitable levels for display by a display device 22. The display amplifier 20 may include a vector generator to provide a continuous waveform display, or the DAC output may be amplified for display in the form of dots. The display device 22 may suitably be a cathode-ray tube. The circuit described thus far is conventional and well known in the art, and no further elaboration of the actual circuits, or the sample- and display-clocking arrangements therefor, are deemed necessary for an understanding of the present invention. Typically, the vertical deflection system thus described in operable in two modes: waveform acquisition and waveform display modes. This permits the input signal to be sampled and acquired at high rates and then displayed at a comparatively low rate so that the display circuitry may have a low frequency response. Preamplifier 12, ADC 14, and memory 16 are utilized in the acquisition mode, and memory 16, DAC 18, display amplifier 20, and display device 22 are utilized in the display mode.

A position control circuit includes a position voltage generator 30, a track and hold circuit 32, and a summing circuit 34 coupled to both the preamp 12 and display amplifier 20 to position a signal both before and after digitizing without shifting the level of the signal when switching between the acquisition and display modes. The position voltage generator 30 may suitably include a potentiometer to provide at the wiper arm thereof a variably-adjustable positioning voltage in the conventional manner, and this voltage is applied to the preamp 12 to provide the appropriate level-shifting of the input signal to position the signal within the operating-limit window of ADC 14 during the waveform acquisition mode. In the acquisition mode, the track and hold circuit 32 develops a reference voltage which is equal in amplitude to the position voltage from position voltage generator 30. This reference voltage is applied to the summing circuit 34, where it is subtracted from the position voltage to provide an output therefrom of zero volts to be applied to display amplifier 20 in the acquisition mode. Thus in the acquisition mode, the preamp 12 receives position voltage to position the signal as desired, but the display amplifier 20 receives a zero input and thus the positioning level is unaffected. In the display mode, the tracking portion of track and hold circuit 32 is disconnected so that the position voltage at the moment of switching between acquisition and display modes is held, providing a fixed reference voltage to the summing circuit 34. As the output of the position voltage generator 30 is changed, the variable position voltage is summed with the fixed voltage, permitting the output of the summing circuit 34 to vary with changes in the position voltage so that the display may be vertically positioned as desired. The effect is that, upon switching to the display mode, the display amplifier position voltage is initially zero and thus no shifting of levels takes place. Then as the position voltage is changed, the output of summing circuit 34 moves away from zero volts, providing display positioning.

The details of the position control circuit in accordance with the preferred embodiment are shown in FIG. 2. A potentiometer 50 is connected between suitable voltage sources to provide a position voltage between + and − V at the wiper arm thereof. The positioning voltage is applied to the non-inverting input of a buffer amplifier 52, which is an operational amplifier connected as a voltage follower, so that the voltage available at node 54 is essentially that tapped from the potentiometer. This voltage is applied via a resistor 56 to the non-inverting input of a comparator 58, and thence to the input of a successive approximation register 60.

First to be discussed is the waveform acquisition mode. The successive approximation register 60 is enabled, and operates at a rate determined by a clock 62 to track changes in the position voltage at node 54. The output of the successive approximation register 60 is a digital signal representative of the position voltage, and the digital representations are converted back to analog values by a DAC 64. The regenerated analog value is applied to an inverting operational amplifier consisting of amplifier 66 and feedback resistor 68 to develop at node 70 a reference voltage which is equal in amplitude, but opposite in polarity, with the position voltage at node 54. A resistor 72, which has a resistance value equal to that of resistor 56, is connected between node 70 and the non-inverting input of comparator 58 to complete the feedback path therefor. A pair of equal-valued resistors 80 and 82 are connected between nodes 54 and 70 to provide a summing circuit. Because in the acquisition mode the absolute value of the reference voltage amplitude at node 70 tracks the amplitude of the voltage at node 54, the algebraic summation thereof at node 84 is zero volts at the completion of the track and hold cycle. The position voltage at node 54 is applied to the acquisition preamplifier as discussed above in connection with FIG. 1, while a switch 90 is interposed between node 84 and the display amplifier to disconnect the position control circuit from the display amplifier in the acquisition mode.

In the display mode, the successive approximation register 60 is disabled, and switch 90 connects node 84 to the display amplifier. Switch 90 may suitably be a transistor or a complementary metal-oxide semiconductor (CMOS) switch. The successive approximation register holds the position voltage value that it contained at the time of acquisition mode-to-display mode switching, so that the reference voltage at node 70 is fixed at the opposite polarity of that value. Initially, the summation at node 84 is zero volts, so that no shifting of the positioning level takes place in the displaying amplifier. Now, as potentiometer 50 is adjusted, the voltage at node 54 varies with respect to the fixed voltage at node 70, causing the summation voltage at node 84 to vary, providing positioning voltage for the display amplifier.

As can be discerned from the foregoing, the only front panel controls required for the associated digital oscilloscope are a single position control and a mode switch. The enable-disable signals for the successive approximation register 60 and switch 90 may be developed directly from the mode switch, or from internal logic control circuitry.

It will be obvious to those having ordinary skill in the art that many changes may be made in the above-described details of the preferred embodiment of the present invention. Therefore, the scope of the present invention should be determined only by the following claims.

I claim:

1. A position control circuit for a digital oscilloscope having a vertical deflection system including an input preamplifier operable in an acquisition mode and a display amplifier operable in a display mode, comprising:
    means for generating a variably adjustable position voltage in both said acquisition and display modes, said position voltage being coupled to said preamplifier;
    means for tracking said position voltage in said acquisition mode to develop a reference voltage which is equal in amplitude to said position voltage, and for holding said reference voltage at a fixed value in said display mode; and
    summation means for subtracting said reference voltage from said position voltage to thereby provide an algebraic summation voltage, said summation voltage being coupled to said display amplifier.

2. A position control circuit in accordance with claim 1 wherein said position voltage generating means includes a potentiometer disposed between a pair of predetermined voltage sources.

3. A position control circuit in accordance with claim 1 wherein said track and hold means comprises a comparator coupled to said position voltage generating means, a successive approximation register coupled to said comparator, and a digital-to-analog converter coupled to said successive approximation register.

4. A position control circuit in accordance with claim 1 wherein said summation means includes a pair of equal-valued resistors serially disposed between said position voltage generating means and said tracking and holding means, wherein the output of said summation means is taken between said resistors.

5. A position control circuit in accordance with claim 4 wherein said summation means further includes means for changing the polarity of said reference voltage.

* * * * *